United States Patent [19]
Debnath et al.

[11] Patent Number: 5,564,022
[45] Date of Patent: Oct. 8, 1996

[54] METHOD AND APPARATUS FOR AUTOMATICALLY INSERTING CLOCK BUFFERS INTO A LOGIC BLOCK TO REDUCE CLOCK SKEW

[75] Inventors: Goutam Debnath; Kelly J. Fitzpatrick, both of Beaverton, Oreg.

[73] Assignee: Intel Corporation, Santa Clara, Calif.

[21] Appl. No.: 193,789

[22] Filed: Feb. 9, 1994

[51] Int. Cl.[6] .................................................. H01L 27/04
[52] U.S. Cl. ...................... 395/250; 395/550; 364/239; 364/239.7; 364/284.1; 307/465
[58] Field of Search ..................... 395/250, 550; 326/38, 85; 327/158, 141; 364/491

[56] References Cited

U.S. PATENT DOCUMENTS

| | | | |
|---|---|---|---|
| 5,045,725 | 9/1991 | Sasaki et al. | 326/37 |
| 5,087,829 | 2/1992 | Ishibashi et al. | 327/152 |
| 5,118,975 | 6/1992 | Hillis et al. | 327/158 |
| 5,172,330 | 12/1992 | Watanabe et al. | 364/491 |
| 5,204,559 | 4/1993 | Deyhimy et al. | 327/232 |
| 5,258,660 | 11/1993 | Nelson et al. | 327/141 |
| 5,272,390 | 12/1993 | Watson, Jr. et al. | 307/269 |
| 5,272,729 | 12/1993 | Bechade et al. | 375/118 |
| 5,298,866 | 3/1994 | Kaplinsky | 328/155 |
| 5,307,381 | 4/1994 | Ahuja | 375/107 |
| 5,369,640 | 11/1994 | Watson et al. | 371/1 |
| 5,397,943 | 3/1995 | West et al. | 326/39 |

Primary Examiner—Krisna Lim
Attorney, Agent, or Firm—Blakely, Sokoloff, Taylor & Zafman

[57] ABSTRACT

A method and apparatus for inserting clock buffers to reduce clock skew in a logic block in which the proper placement of the cells within the logic block is first determined. Given this cell placement and the location of the local clock lines, the placement of clock buffers within the logic block is determined such that the clock buffers are in close proximity to the local clock lines. Routing is then performed to connect the clock buffers to their corresponding clock trunks and the cells requiring clock signals to their corresponding clock buffers. The performance of the logic block is then evaluated. If the performance does not satisfy a predetermined minimum threshold then the cells are modified to satisfy the minimum threshold, or come closer to attaining it. The clock buffers are removed, and the proper placement of the new cells within the logic block is determined. Given this new cell placement a new set of clock buffers is placed and a new routing is created. The performance is then re-evaluated and, if the minimum threshold still has not been attained, the above process is repeated.

24 Claims, 9 Drawing Sheets

METHOD AND APPARATUS FOR AUTOMATICALLY INSERTING CLOCK BUFFERS INTO A LOGIC BLOCK TO REDUCE CLOCK SKEW

BACKGROUND OF THE INVENTION

1. Field of the Invention

The present invention pertains to the field of microprocessor architecture and layout. More particularly, this invention relates to placing properly sized clock buffers in the proper location within a logic block to reduce clock skew.

2. Background

Components of an integrated circuit operate based on timing and pulsing of clock signals which provide a reference point or activation signal for circuit activity and processing. The clock signals also provide a timing or alignment reference which different circuits adopt when stepping through their respective processing tasks. It is important that the clocking signals be predictable and not delayed such that processing and execution by circuit components are accomplished in synchronization. Microprocessor integrated circuit devices utilize a system clock which provides timing and pulsing to drive the various elements and processing of the microprocessor.

It is vital to the operation of a microprocessor that the system clock be supplied uniformly to all components of the microprocessor with minimal clock skew. Clock skew refers to the variations in timing delays between a system clock and a clock signal reaching a component. Resistance within the clock line and capacitance on the clock line creates RC skews, a type of clock skew, as the clock signal propagates. Clock buffers can be used to deskew the clock signal, thus a system for automatically placing the proper clock buffers in the correct locations would be advantageous.

A similar problem is that of a minimum delay between latches. A minimum delay problem may arise when the signal from a source latch is input into a receiving latch. If the clock signal driving the receiving latch reaches the receiving latch after the signal from the source latch arrives, the receiving latch may latch the wrong data. Thus, a buffer may be inserted into the line between the two latches to create a delay such that the signal does not arrive prior to the clock signal.

Design techniques for microprocessors may include utilization of a large number of functional blocks in order to shorten the design cycle. The functional blocks consist of a varying number of cells and utilize clock buffers to prevent clock skew. As microprocessors use faster and faster clock speeds, variations in clock skew within the functional blocks becomes a major concern. The slower clock speeds used in older microprocessor technology were slow enough that the clock skew within the functional blocks could be either ignored or resolved easily. However, faster clock speeds require that the problem of clock skew be addressed more efficiently.

In addition, microprocessor development times have become shorter and shorter. Therefore, an automatic system for the designer to insert the properly sized clock buffer in the proper location would be advantageous.

Thus, it would be advantageous to automatically optimally insert the proper clock buffers into the functional blocks. The present invention offers such a solution.

An example prior art placement of clock buffers is shown in FIG. 1A. The clock buffers 110 may have been placed arbitrarily, or at the very least in a non-optimized manner. That is, the clock buffers 110 were not guaranteed to be placed close to the clock line and thereby reduce clock skew. Additionally, as shown, the latches 120 were not necessarily driven by the clock buffer 110 located closest to each latch 120.

Other prior art placements of clock buffers may have attempted to solve the clock skew problem by placing clock buffers close to the latches being driven, as shown in FIG. 1B. However, as is readily apparent in FIG. 1B, the placement of the clock buffers 110 is not optimized because the buffers 110 are not placed close to the clock line 100. The extra distance between the clock line 100 and the buffers 110 over narrower lines 115 cause additional RC skew, thus, the reduction of clock skew is not optimized.

SUMMARY AND OBJECTS OF THE INVENTION

The present invention comprises a method and apparatus for inserting local clock buffers in a logic block. The present invention first determines the proper placement of the cells within the logic block. Then, given the cell placement and the location of the local clock trunks, the invention places the clock buffers within the logic block in close proximity to the local clock trunks. Routing is then performed to connect the clock buffers to their corresponding clock trunks and the cells requiring a clock signal to their corresponding clock buffers.

The performance of the block is then evaluated. If the performance does not meet a predetermined minimum threshold then the cells are modified to attain the minimum threshold, or come closer to attaining it. The clock buffers previously inserted are removed, and the proper placement of the new cells within the logic block is determined. Then, given this new cell placement and the location of the local clock trunks, the invention places a new set of clock buffers within the logic block in close proximity to the local clock trunks. A new routing is then created to connect the clock buffers to their corresponding clock trunks and the cells to their corresponding clock buffers.

The performance of this new block is then evaluated to determine whether it meets the predetermined minimum threshold. If it does, then the process is complete. However, if the minimum threshold is not satisfied then the system repeats the above process, modifying the cells, re-placing them, and re-inserting a new set of clock buffers. This process will be repeated until the minimum threshold is satisfied.

BRIEF DESCRIPTION OF THE DRAWINGS

The present invention is illustrated by way of example and not limitation in the figures of the accompanying drawings, in which like references indicate similar elements and in which.

DETAILED DESCRIPTION

In the following detailed description of the present invention numerous specific details are set forth in order to provide a thorough understanding of the present invention. However, it will be obvious to one skilled in the art that the present invention may be practiced without these specific details. In other instances well known methods, procedures, components, and circuits have not been described in detail as not to unnecessarily obscure the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Figure 1A:
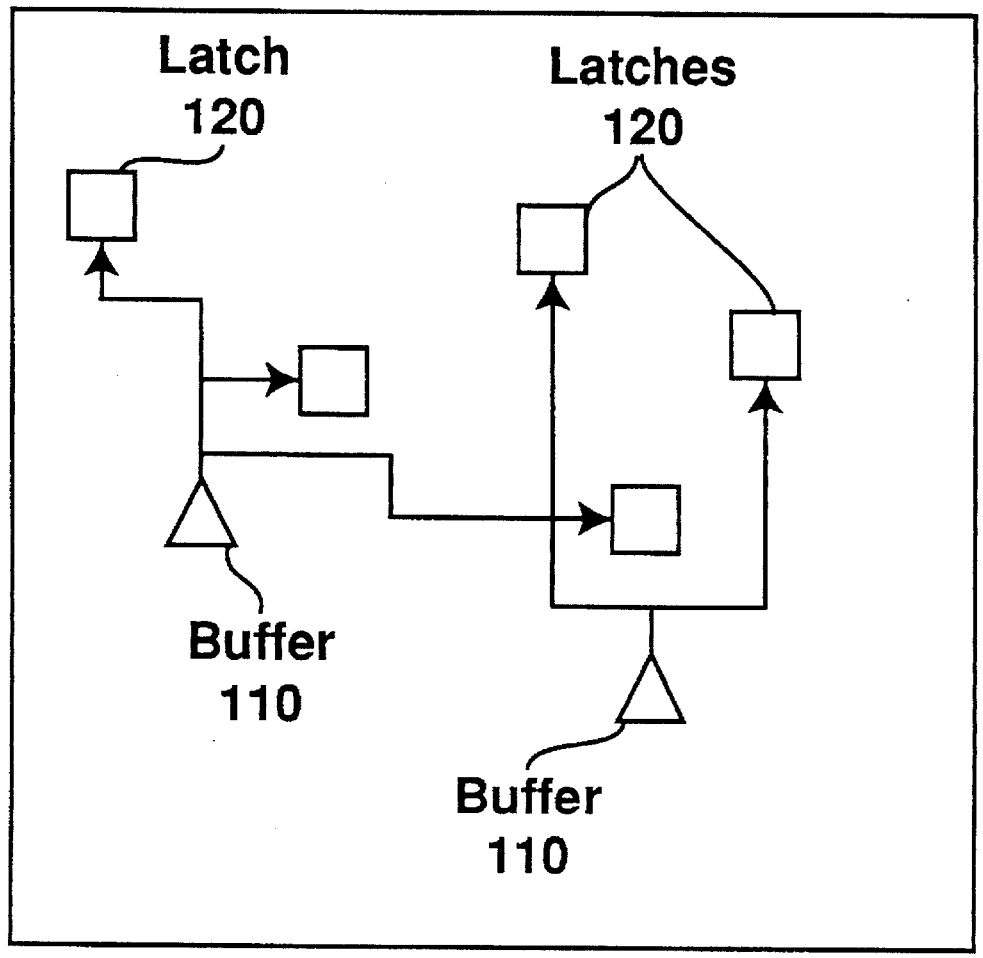
FIG. 1A is a block diagram of a prior art placement of clock buffers.
Figure 1B:
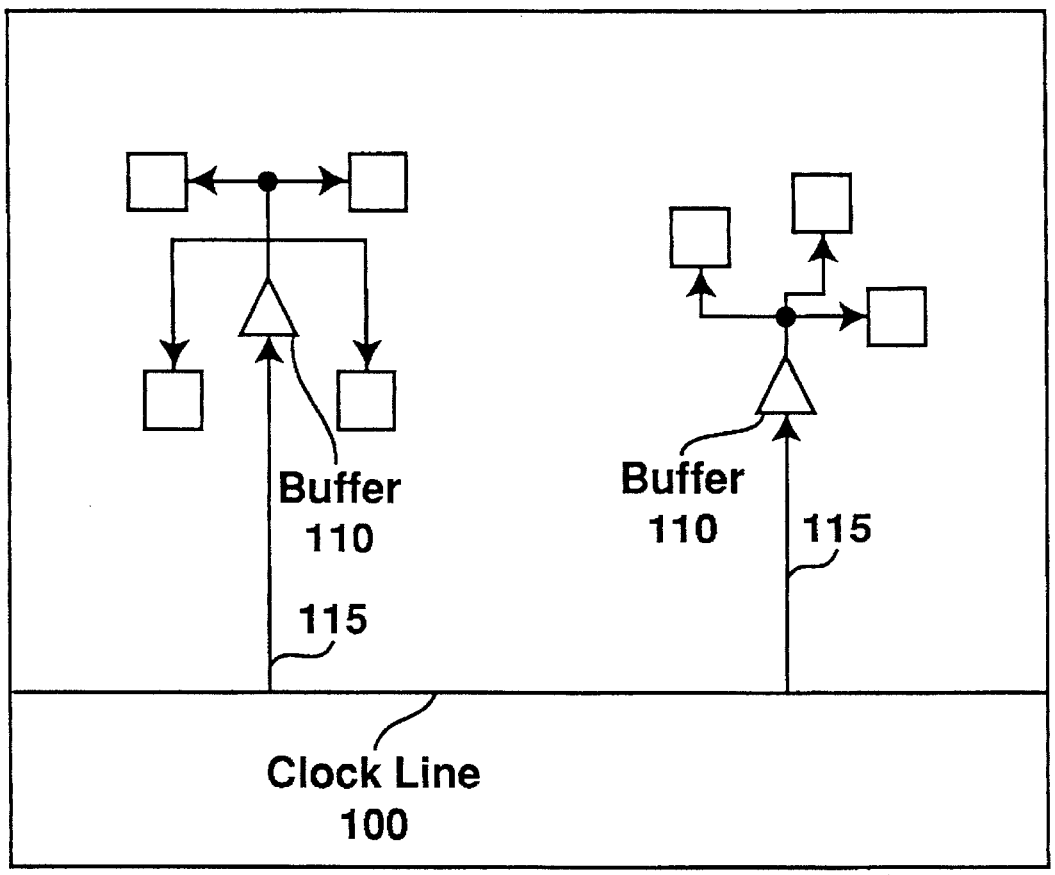
FIG. 1B is a block diagram of a prior art placement of clock buffers.
Figure 2:
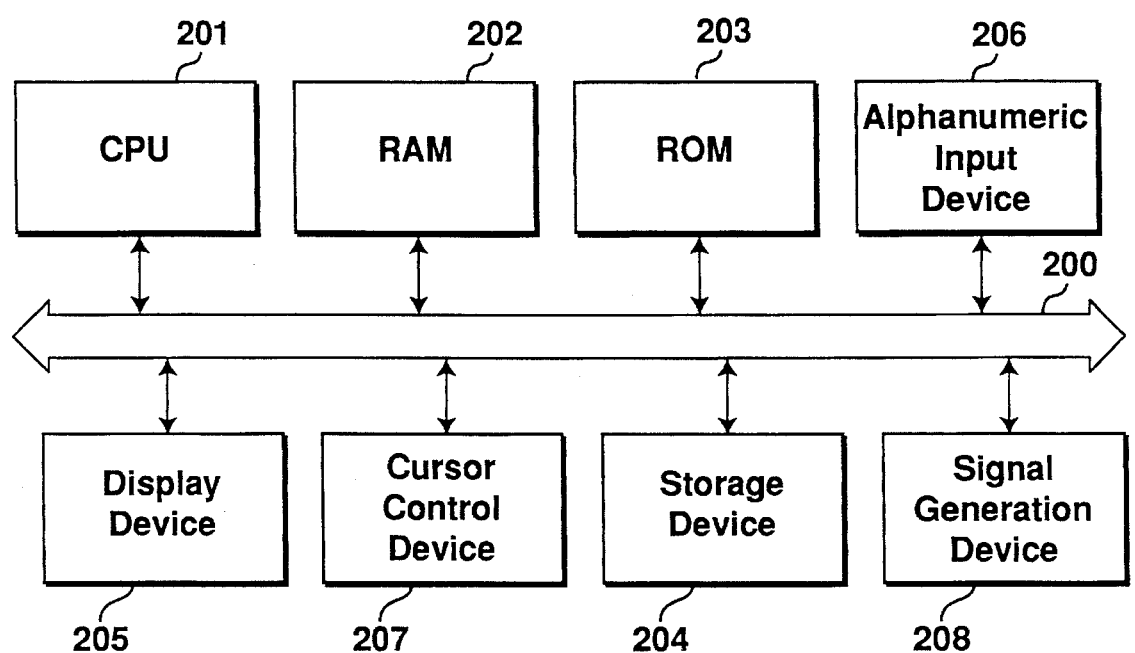
FIG. 2 is a block diagram of a computer system used by the preferred embodiment of the present invention.

In general, computer systems used by the preferred embodiment of the present invention are as illustrated in block diagram format in FIG. 2, and comprise a bus 200 for communicating information, a central processor 201 coupled with the bus for processing information and instructions, a random access memory 202 coupled with the bus 200 for storing information and instructions for the central processor 201, a read only memory 203 coupled with the bus 200 for storing static information and instructions for the processor 201, a data storage device 204 such as a magnetic disk and disk drive coupled with the bus 200 for storing information (such as audio or voice data) and instructions, a display device 205 coupled to the bus 200 for displaying information to the computer user, an alphanumeric input device 206 including alphanumeric and function keys coupled to the bus 200 for communicating information and command selections to the central processor 201, a cursor control device 207 coupled to the bus for communicating user input information and command selections to the central processor 201, and a signal generating device 208 coupled to the bus 200 for communicating command selections to the processor 201.

The display device 205 utilized with the computer system and the present invention may be a liquid crystal device, cathode ray tube, or other display device suitable for creating graphic images and alphanumeric characters (and ideographic character sets) recognizable to the user. The cursor control device 207 allows the computer user to dynamically signal the two dimensional movement of a visible symbol (pointer) on a display screen of the display device 205. Many implementations of the cursor control device are known in the art including a trackball, mouse, joystick or special keys on the alphanumeric input device 205 capable of signaling movement of a given direction or manner of displacement. It is to be appreciated that the cursor means 207 also may be directed and/or activated via input from the keyboard using special keys and key sequence commands. Alternatively, the cursor may be directed and/or activated via input from a number of specially adapted cursor directing devices, including those uniquely developed for the disabled. In the discussions regarding cursor movement and/or activation within the preferred embodiment, it is to be assumed that the input cursor directing device or push button may consist of any of those described above and specifically is not limited to the mouse cursor device.

Logic blocks comprising a plurality of standard cells are well known in the art. In the preferred embodiment of the present invention, these cells are placed and the proper clock buffers to drive the latches (or any other cells requiring a clock signal) are automatically inserted; the block is then modified, if necessary, to satisfy performance requirements.

Figure 4A:
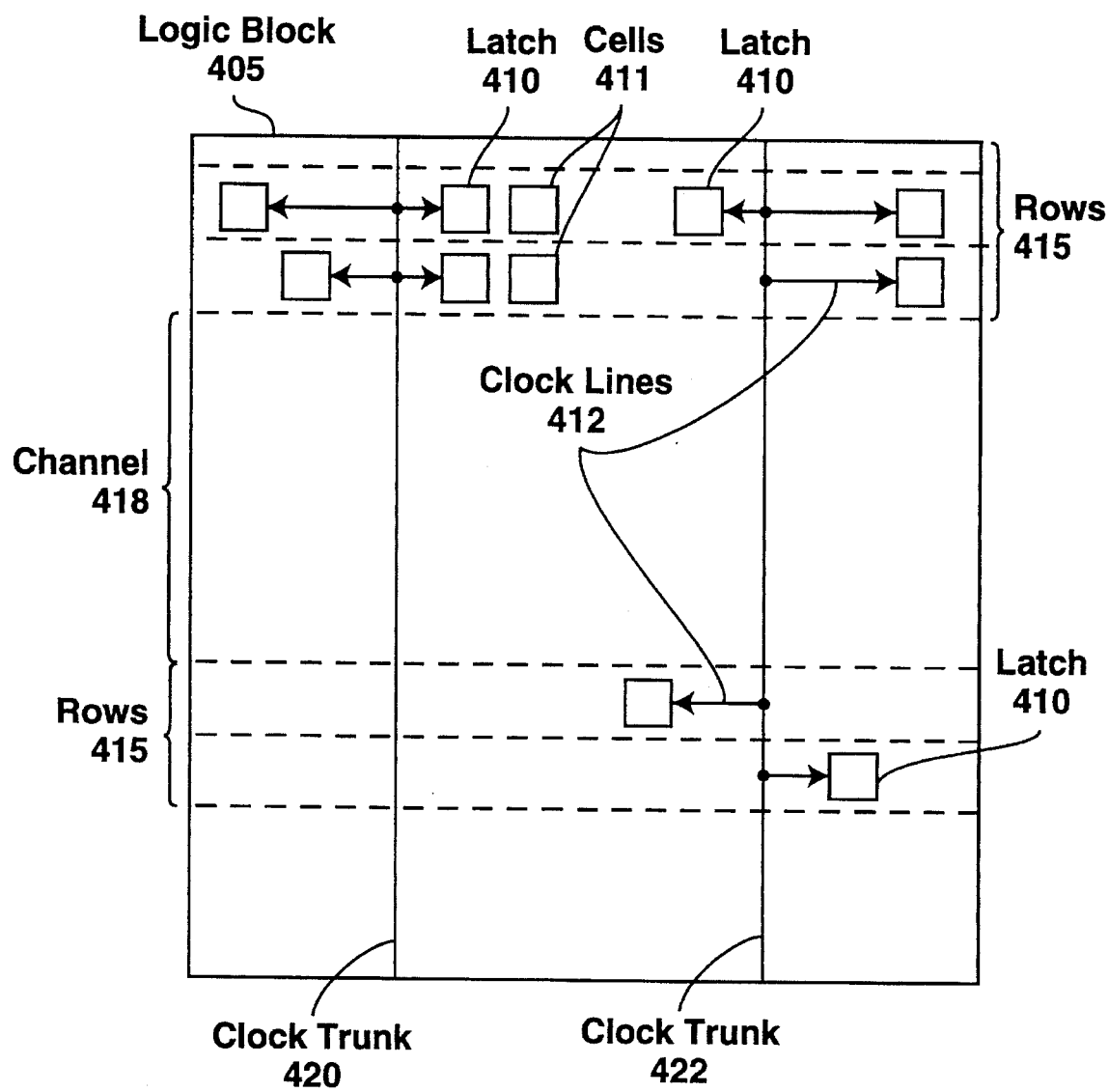
FIG. 4A is a diagram showing the placement of cells without clock buffers in the preferred embodiment of the present invention.

In the preferred embodiment, the cells are placed within the logic block in a double back row configuration. That is, cells are placed in pairs of rows 415 separated by channels 418, as shown in FIG. 4A. However, it should be readily apparent to those of ordinary skill in the art that the present invention may be utilized in any of a wide variety of placement configurations.

Figure 3:
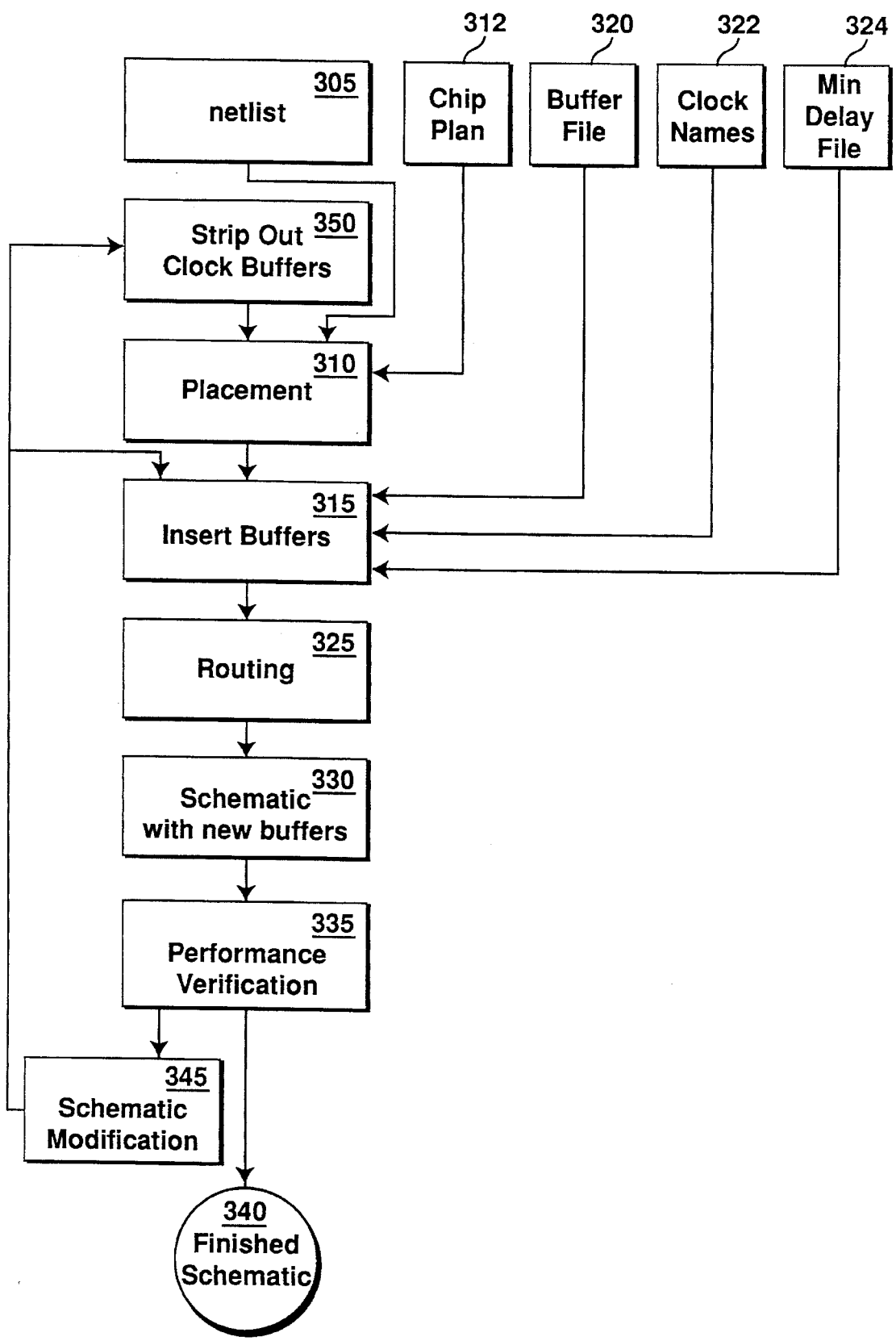
FIG. 3 is a flow chart of the steps of the preferred embodiment of the present invention.

A flowchart of the method of the preferred embodiment of the present invention is shown in FIG. 3. A schematic, or netlist, is first created, step 305, which describes the connectivity between the cells within the block. In a logic block with multiple clock signals the schematic also describes which clock signal should be connected to, and therefore drive, which latches. If a particular logic block utilized only a single clock signal, then the schematic would describe each latch as being connected to that single clock signal. The schematic also contains the loads of each latch within the schematic, which is described in more detail below.

The schematic defines the connectivity between cells and clock signals, however, it does not describe the placement of the cells in relation to one another or the clock trunks. In the preferred embodiment of the present invention, a netlist is used to describe the connectivity, however it should be apparent to those of ordinary skill in the art that any description of the cell connectivity could be used.

The netlist from step 305 is input into a standard cell placement system, step 310. The cell placement system places the cells within the row pairs to optimize the routing and the area of the logic block. Thus, the cell placement system places the cells to obtain the best connectivity between the cells. In the preferred embodiment of the present invention, the Timberwolf placement algorithm is used by the placement system in step 310. It should be apparent to those of ordinary skill in the art, however, that any standard cell placement system may be utilized.

In the preferred embodiment, an additional input to the placement system is the chip plan 312. The chip plan 312 is a description of the pin layout of the chip containing the logic block being designed. One element of the chip plan 312 is a description of the local clock line(s) which drive the cells within the logic blocks on the chip. Thus, the chip plan 312 identifies to the placement system the location(s) of the clock line(s) used by any particular logic block.

An example placement of cells is shown in FIG. 4A. Multiple latches 410 are shown placed within multiple double back rows 415 in a logic block 405. Additional cells 411 which do not require a clock signal are also shown. A channel 418, containing no cells, is located between each row pair 415. Only two row pairs 415 are shown in FIG. 4A to avoid unnecessarily cluttering the drawing. It should be apparent to those of ordinary skill in the art that the number of row pairs 415 within a block could vary among blocks, with the maximum limit being based on the size of the block 405.

Multiple clock trunks 420 and 422 are also shown in FIG. 4A. Local clock trunks 420 and 422 may be driven by the same (system) clock or by separate clocks. The location of these trunks 420 and 422 are provided by the chip plan 312, described above.

The placement system, step 310 of FIG. 3, places the cells within the row pairs as described above. If the standard routing were performed, without the insertion of clock buffers, the latches would be connected directly to the clock trunks over clock lines 412, as shown in FIG. 4A. Such a placement creates a substantial clock skew problem as a result of RC skew due to the narrowness of clock lines 412 and the differences in loads being driven. Furthermore, the prior art placement of clock buffers would not optimally solve the clock skew problem, as discussed above.

After the placement of the cells is completed, the proper clock buffers are inserted, step 315. The clock buffers are inserted based on the placement of the cells determined in step 310, the information in the clock buffer file 320, and the information in the clock names file 322.

The clock names file 322 lists the names of the separate clock signals which are utilized in the logic block 405. For example, FIG. 4A shows a logic block 405 having two clock trunks 420 and 422. Clock trunks 420 and 422 could carry the same clock signal, e.g. CLOCKA. Alternatively, clock trunks 420 and 422 may carry separate clock signals, e.g. clock line 420 may carry CLOCKA while clock trunk 422 may carry CLOCKB. The location of these clock trunks is described in the chip plan 312. The clock signal on each clock trunk is described in the clock names file 322.

The clock buffer file 320 contains a description of the clock buffers available for use by the present invention. A wide variety of commercially available buffers exist which could be utilized by the present invention. Each clock buffer which could be used has a $C_{min}$ and a $C_{max}$ value associated with it. The $C_{min}$ value is the minimum capacitance load the buffer is capable of driving, whereas $C_{max}$ is the maximum load the buffer is capable of driving. Thus, the clock buffer file 320 contains a description of the clock buffers available and their respective $C_{min}$ and $C_{max}$ values. Table 1 shows the data contained within an example clock buffer file.

TABLE 1

| Buffer | $C_{min}$ | $C_{max}$ |
|---|---|---|
| Buffer A | 0.079 | 0.115 |
| Buffer B | 0.115 | 0.170 |
| Buffer C | 0.170 | 0.255 |
| Buffer D | 0.255 | 0.380 |
| Buffer E | 0.380 | 0.566 |
| Buffer F | 0.566 | 0.851 |
| Buffer G | 0.851 | 1.274 |
| Buffer H | 1.274 | 1.903 |

The present invention determines the proper size and number of clock buffers to be used based on the clock buffers described in clock buffer file 320 and the load to be driven by the buffer(s) within a row pair. The load to be driven by the buffer(s) is based on the load of the latches 410 to be driven and the load of the line connecting the buffer(s) to the latches 410. These loads were received as inputs to the placement system 310. That is, the original netlist from step 305 contains the loads of each latch contained therein. This information is contained in an auxiliary file along with the netlist in the preferred embodiment. The load of the line is determined based on the length of the line and its load per unit length. The load per unit length may be input separately at the clock buffer insertion step, or may be input from the placement system along with the latch loads. The length of each line can be determined given the location of the clock trunks 420 and 422 and the placement of the cells in step 310.

It should be noted that in the preferred embodiment of the present invention a minimum threshold exists below which the load of a particular line need not be considered. The main load being driven by a clock buffer in the present invention is the latches. Thus, if a line between a buffer and a clock trunk or latch is short enough, the load will be insignificant relative to the load of the latches and can safely be ignored.

In the currently preferred embodiment of the present invention, the load of a line may be safely ignored if the length is less than 150 microns. Furthermore, in the currently preferred embodiment, the chip plan 312 has the clock trunks 420 and 422 located no more than 300 microns apart. Thus, the length of the lines connecting the clock buffers and the latches 410 may be safely ignored.

Given the loads to be driven by the clock buffer(s) and the load each buffer is capable of driving, the present invention matches these values and determines the proper size and number of buffers required to drive the load. In the currently preferred embodiment of the present invention, a single buffer will be used to drive the load. If a single buffer large enough to drive the load is not available in clock buffer file 320 then an additional buffer(s) will be added. For example, suppose the clock buffer file 320 contained two buffers, BUF1 having a $C_{min}$ of 0.566pF and $C_{max}$ of 0.851pF, and BUF2 having a $C_{min}$ of 0.851pF and a $C_{max}$ of 1.274pF. Further suppose that the load to be driven by the buffer(s) was 1.900pF. The present invention would compare these values and determine that two buffers are required to drive the load: a BUF1 and a BUF2.

The currently preferred embodiment utilizes a single buffer to drive the load if one of an appropriate size is available. However, it should be readily apparent to those of ordinary skill in the art that multiple smaller buffers may be used rather than a single larger buffer.

Having determined the size and number of clock buffers to use, the currently preferred embodiment of the present invention places the buffers in the row pairs 415 and modifies the netlist such that the latches receive clock signals from a buffer in the row pair rather than directly from the clock trunks 420 or 422. The present invention places the clock buffers as close as possible to the clock trunk 420 or 422 which is closest to the latch being driven. That is, the present invention places the clock buffers in the available position within the row pairs 415 which is closest to the clock trunks 420 and 422. Alternatively, the present invention may place the clock buffers right below and very close to the clock trunks 420 and 422. Thus, the distance between the clock trunk and the clock buffer is minimized. The present invention modifies the netlist to include the clock buffers in these closest available positions to the clock trunks.

The placement of clock buffers is performed within each row pair 415 for each clock trunk 420 and 422. Thus, each clock trunk 420 and 422 will have at least one clock buffer 430 placed close to it in each row pair which has a cluster of latches (or single latch) to be driven.

Figure 4B:
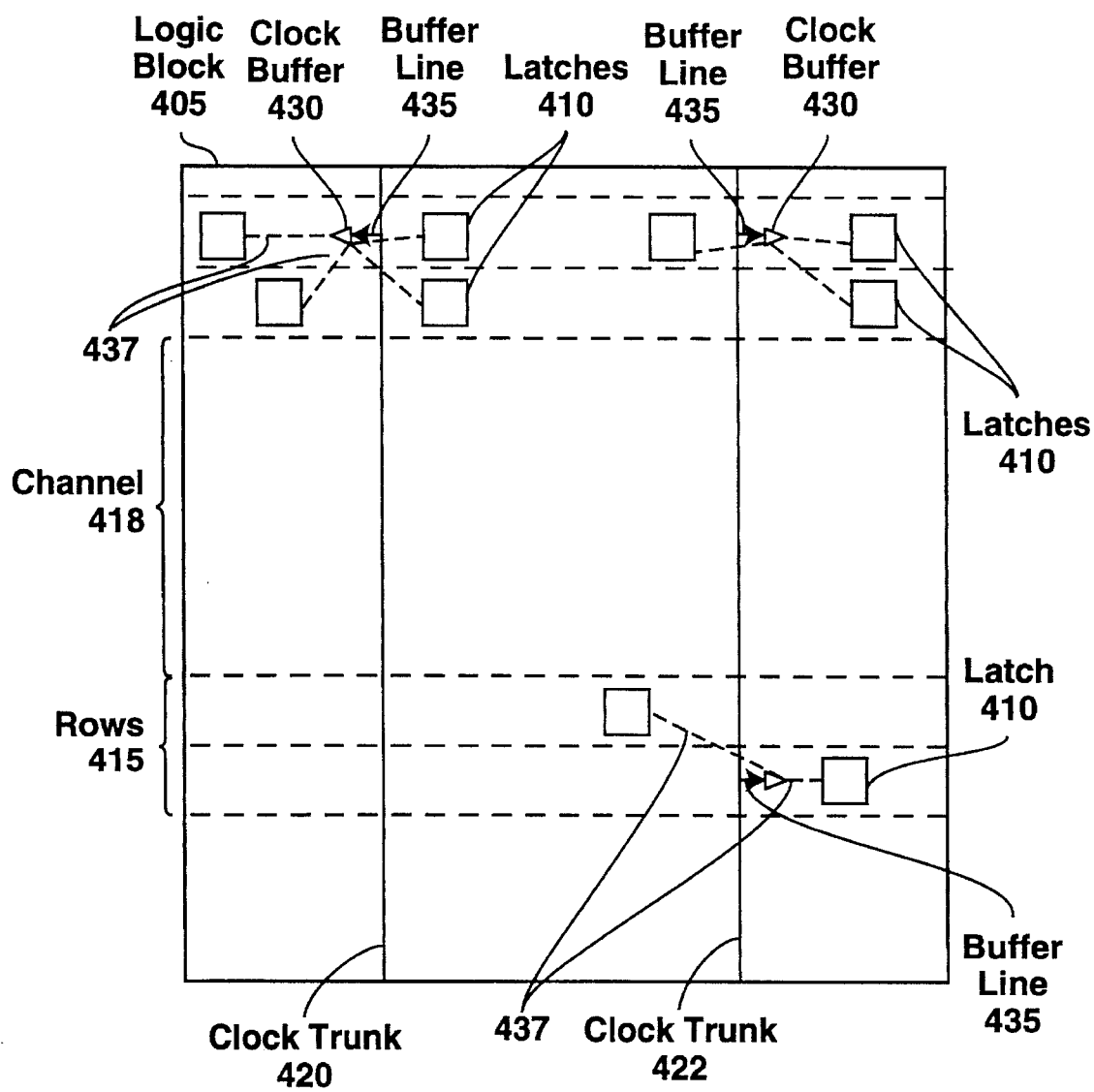
FIG. 4B is a diagram showing the placement of cells and clock buffers before routing in the preferred embodiment of the present invention.

FIG. 4B shows the placement of clock buffers 430 within row pairs 415 of a logic block 405. Note that the buffer lines 435 will not actually be placed until routing step 435. Clock trunks 420 and 422 are wider than buffer lines 435 will be, therefore they cause a lower RC delay (and therefore result in less clock skew). When the clock signals travel from a clock trunk 420 or 422 to a clock buffer 430 over buffer line 435, the RC delay is greater because the lines 435 are narrower. Thus, by placing the buffers 430 very close to the clock trunks 420 and 422 the length of the lines 435 is reduced, and the RC delay attributable to the lines 435 is minimized.

In the currently preferred embodiment of the present invention the RC delay caused by the lines 435 is below the minimum threshold, discussed above. Thus, the load attributable to the buffer wires 435 may be safely disregarded. The load attributable to the buffer wires 435 will be below the minimum threshold because the clock buffers are inserted close to the clock trunks. Note that under certain circumstances the row pairs could be full of cells such that no place is available for a clock buffer. In this situation, the present invention may reposition the cells relative to the clock trunks in order to create a position for the clock buffer. This repositioning, however, could result in a cell being pushed outside of the functional block boundary. In such a situation, the placement of the cells, step 310, must be repeated, or alternatively the chip plan 312 must be modified to increase the size of the functional block.

Note that in some instances multiple clock buffers 430 may be inserted into a row pair to drive multiple latches 410 within that row pair. In this situation the present invention must determine which latches are driven by which buffers. The preferred embodiment of the present invention resolves this situation by determining the latches closest to each buffer, as determined by the modified netlist. The present invention will drive latches 410 with the buffer 430 closest to each latch 410, limited by the loads being driven and the $C_{min}$ and $C_{max}$ of each buffer, described above.

A related situation is determining which buffer drives a latch located between two clock trunks. In the preferred embodiment of the present invention the buffer which is closest to the latch in question will drive the latch. However, it should be readily apparent to those of ordinary skill in the art that other solutions may exist, such as having a buffer with extra driving capacity drive the latch even though it may not be closest.

FIG. 4B shows a logic block 405 after insertion of the clock buffers 430. Dashed lines 437 show the modified connections between the latches and the clock buffers 430. As shown, the latches 410 are no longer directly connected to the clock trunks 420 and 422. The latches 410 receive clock inputs from the clock buffers 430, as described above, which in turn are connected to the clock trunks 420 and 422 over buffer lines 435.

It should be noted that the rare situation may occur in which a single latch is placed in a row pair having a load smaller than the smallest $C_{min}$ in the clock buffer file 320. In the preferred embodiment of the present invention, this problem is resolved by repeating step 310. That is, the placement system replaces the cells repeatedly until no such single latch remains. Alternatively, the designer may manually place an existing clock buffer of the appropriate size to drive that single latch.

The preferred embodiment of the present invention determines the proper routing for the block, step 325, after completing the insertion of the clock buffers. The routing system takes the modified netlist and determines the best routing between the clock buffers 430 and the latches 410 each buffer is driving. Routing systems are well known in the art and any commercially available routing system may be utilized to perform the routing step 325.

Figure 4C:
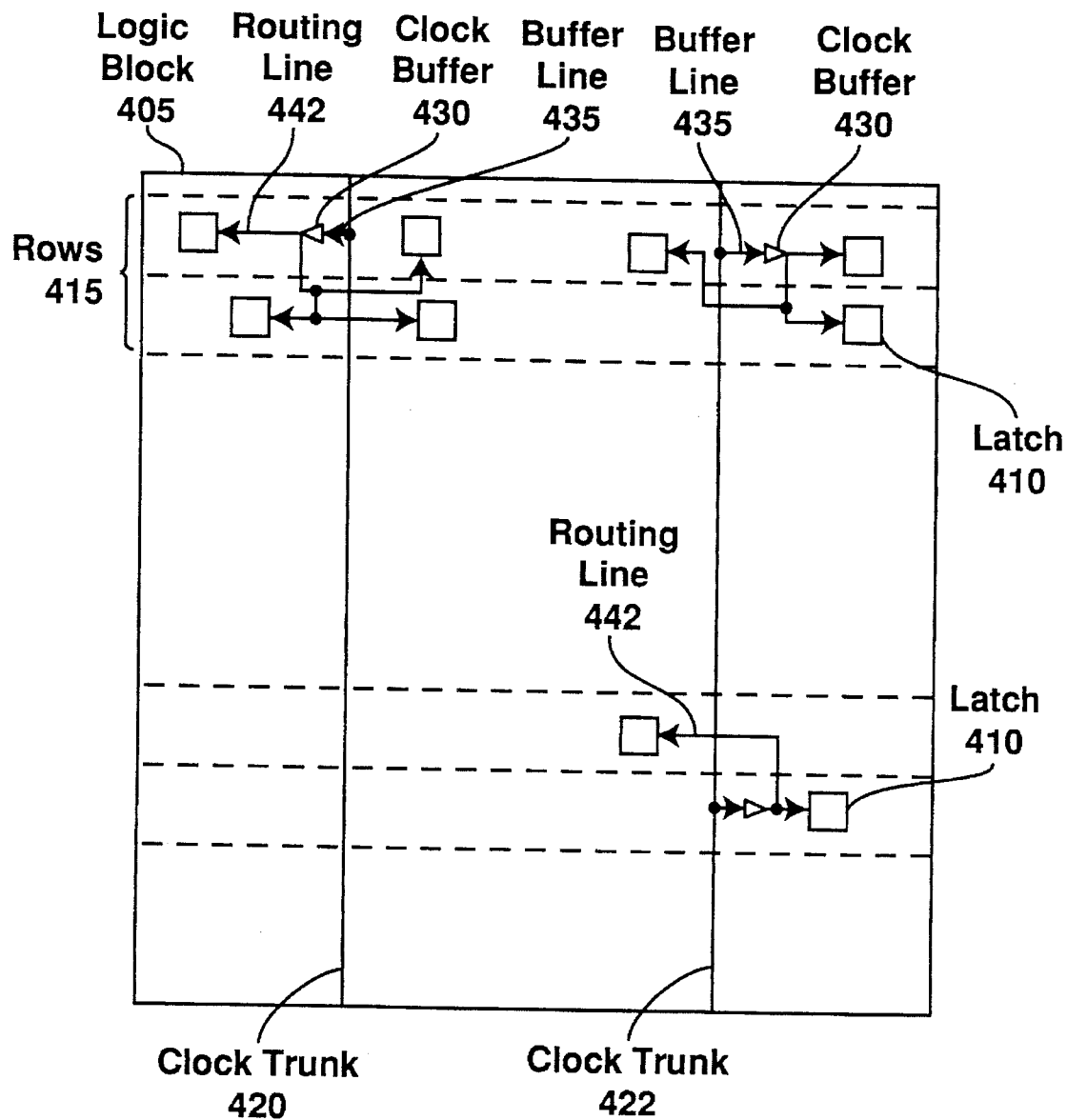
FIG. 4C is a diagram showing the placement of cells and clock buffers after routing in the preferred embodiment of the present invention.

Upon completion of routing step 325, a new schematic is produced, step 330, having all cells and buffers placed and the routing completed. An example schematic is shown in FIG. 4C, showing the routing lines 442 placed in routing step 325.

The new schematic is then input into an analysis system, step 335, which performs a performance verification of the logic block 405. In analysis step 335 the performance of the block 405 is compared to a minimum performance threshold defined by the system designer. This threshold is typically the minimum speed at which block 405 must run in order to function properly within the environment the block 405 is to be placed. Such analysis systems are well known in the art and thus will not be discussed further.

Upon completion of the analysis step 335, one of two actions may be taken. If the minimum performance threshold was satisfied then the present invention outputs a finished schematic, step 340. However, if the minimum threshold is not satisfied, then the schematic is further modified to attain or approach the minimum performance threshold, step 345.

The analysis system which performed the timing analysis in step 335 is also capable of modifying the cells within the logic block 405. A wide variety of optimization techniques exist, such as upsizing gates to make signals faster. Any of a wide variety of optimization techniques known to those of ordinary skill in the art may be utilized to attain or approach the minimum timing threshold. It should be readily apparent to those of ordinary skill in the art that although these optimization techniques are designed to attain or approach a minimum timing threshold, under certain circumstances a particular technique may modify cells such that timing is not improved.

These optimization techniques, however, may affect the placement of the cells within the row pairs. For example, after modification the cells may be too large to fit within the row pairs as they previously did. Thus, the cells in block 405 must be replaced by the placement system, as done in step 310. Before this can be accomplished, however, the clock buffers 430 which were inserted in step 315 must be removed from the netlist because their placement will no longer be optimal due to the re-placement to be performed in step 310.

Figure 5A:
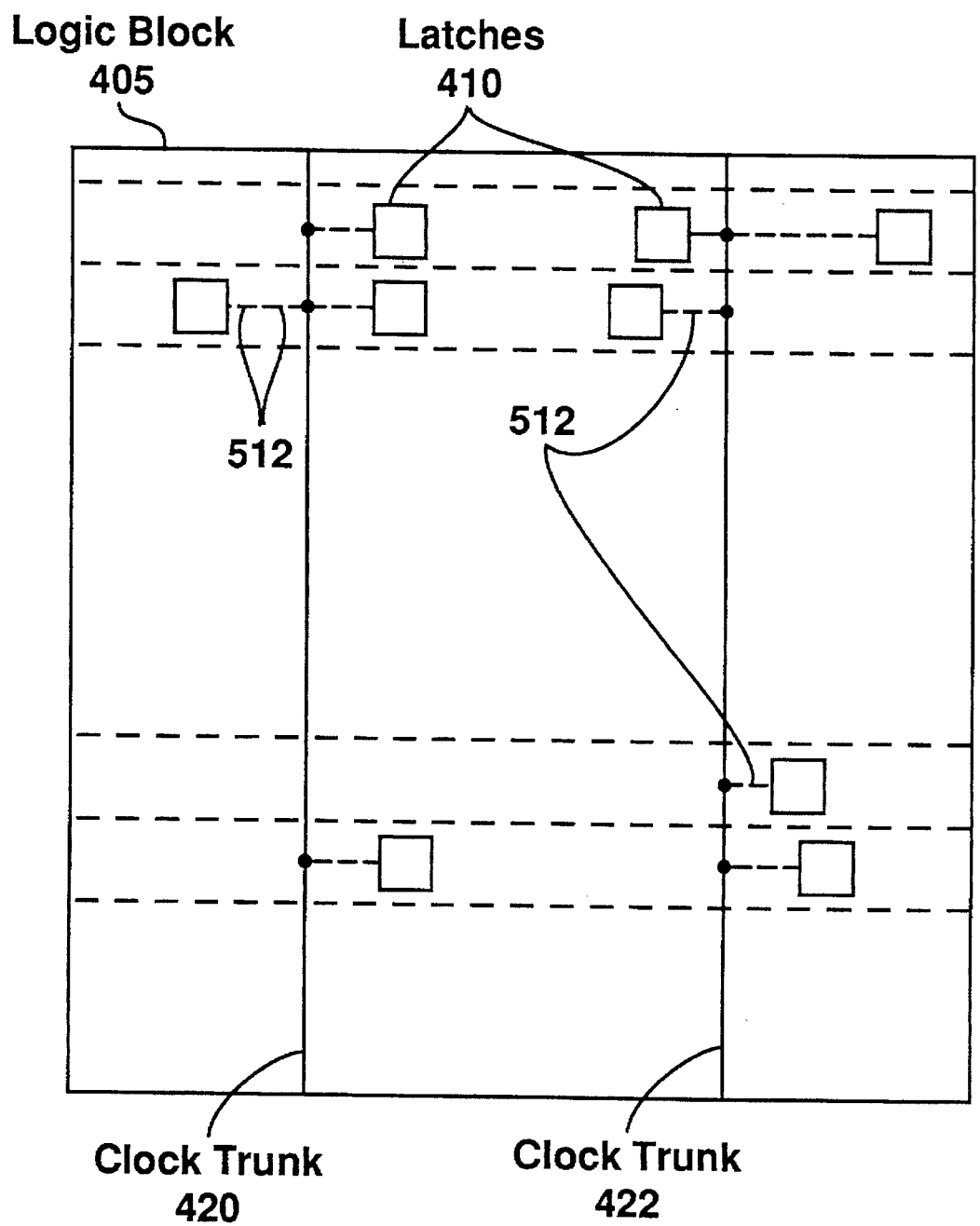
FIG. 5A is a diagram showing the placement of cells after having the clock buffers stripped in the preferred embodiment of the present invention.

The clock buffers 430, previously placed in step 315, are removed in step 350. This removal is automatic; that is, no user intervention is required. The present invention further modifies the netlist from step 345 by eliminating the clock buffers; the netlist is also modified such that the latches, which previously received clock signals from a clock buffer, now receive a clock signal directly from a clock trunk 420 or 422, as shown in FIG. 5A. The dashed lines 512 show which signals drive which latches, however the actual routing has not occurred yet. It should also be noted that the location of the cells shown in FIG. 5A has no significance as the cells have not been placed yet.

Figure 5B:
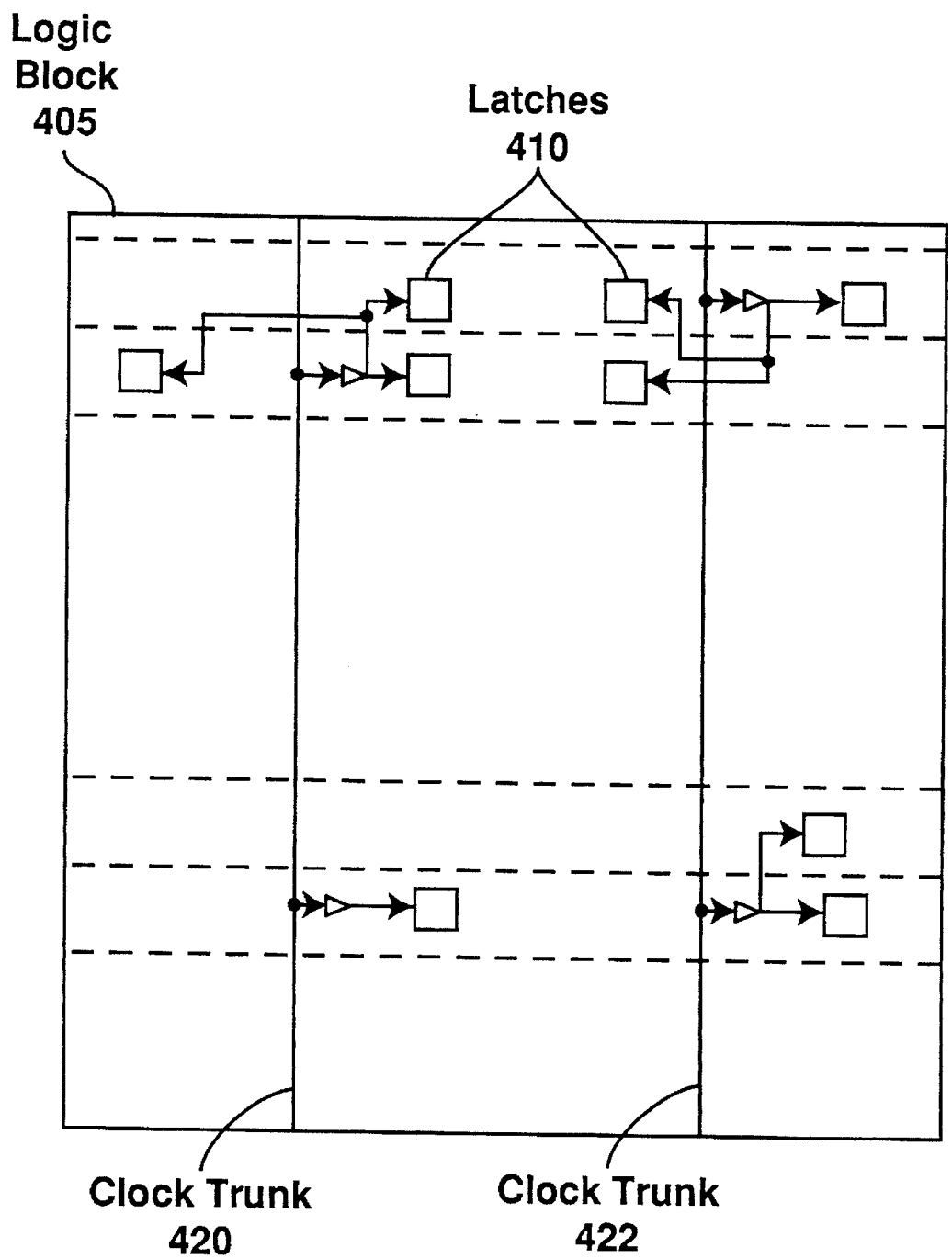
FIG. 5B is a diagram showing a new placement of cells and clock buffers in the preferred embodiment of the present invention.

After removal of the clock buffers, the schematic, without the buffers, is again input into the placement system, step 310. The placement system, described above, will re-place the modified cells as described above. The present invention will repeat steps 315 through 325 as described above, producing a new schematic at step 330. An example of a new schematic is shown in FIG. 5B.

The timing analysis, step 335, will be performed again. As described above, if the new schematic satisfies the performance requirements then the present invention will output a finished schematic, step 340. If the performance requirements are still not satisfied, the cells will again be modified, the clock buffers removed, and the above process repeated. The above process will be repeated until the performance requirements are satisfied.

In an alternate embodiment, an additional buffer may be inserted between two latches after the performance verification of step 335. The performance verification may determine that a minimum delay problem exists, that is, the signal from one latch may be arriving at the receiving latch prior to the arrival of the clock signal. If this minimum delay problem is the only remaining problem, it may be desirable to not re-place the cells again. Thus, a buffer may be inserted after the performance verification to delay the signal and avoid latching the wrong data into the receiving latch.

Thus, the buffer is inserted, step 315. The proper size buffer to insert is input at step 315 and is selected based on the minimum delay required, as determined at performance verification, step 335. That is, the proper size buffer will generate a delay greater than the minimum delay required. A minimum delay file 324 contains a set of minimum delays which must be resolved and the latches or elements each minimum delay is associated with, and contains buffers to solve each minimum delay problem.

Given the size of the buffer needed and the latch which has the minimum delay problem, the present invention inserts the proper buffer. Since the buffer resolves the minimum delay problem between the two latches, it may be placed anywhere along the signal path from the source latch to the receiving latch. According to the present invention, buffers are placed in any available location along the signal path.

Routing, step 325, is then repeated. The placement of existing cells was not modified, thus the routing will change minimally. Upon completion of the routing a new schematic is generated, step 330, and the performance verification repeated, step 335. The insertion of the buffers to solve the minimum delay problems should resolve the remaining timing concerns, thus a finished schematic will be output, step 340.

It should be noted that if another minimum delay problem arises, steps 315 through 340 may be repeated at a future date. In such a situation, a buffer which resolves the minimum delay is inserted, step 315, routing takes place as discussed above, and a new finished schematic is produced, step 340.

The preferred embodiment of the present invention, a method and apparatus for inserting clock buffers, is thus described. While the present invention has been described in particular embodiments, it should be appreciated that the present invention should not be construed as limited by such embodiments, but rather construed according to the below claims.

What is claimed is:

1. A method for automatically reducing clock skew in a logic block having a plurality of cells, the method comprising the steps of:

(a) determining a placement of said plurality of cells within said logic block;

(b) determining a placement of a plurality of clock buffers within said logic block such that each clock buffer of said plurality of clock buffers is located in close proximity to a clock line; and (c) determining a routing between said plurality of clock buffers, said plurality of cells and said clock line.

2. A method for reducing clock skew as claimed in claim 1 further comprising the step of:

(d) determining the performance of said logic block.

3. A method for reducing clock skew as claimed in claim 2 further comprising the steps of:

(e) removing said plurality of clock buffers from said logic block if said performance is below a predetermined minimum threshold;

(f) modifying at least one cell of said plurality of cells if said performance is below said minimum threshold; and (g) repeating steps (a) through (g) if said performance is below said minimum threshold.

4. A method for reducing clock skew as claimed in claim 1 wherein said step of determining a placement of a plurality of clock buffers comprises locating each clock buffer of said plurality of clock buffers in a closest available position to a clock line.

5. A method for reducing clock skew as claimed in claim 1 wherein said step of determining a placement of said plurality of cells comprises receiving a description of connectivity between a plurality of cells.

6. A method for reducing clock skew as claimed in claim 1 wherein said step of determining a placement of a plurality of clock buffers further comprises receiving a description of the location of said clock line.

7. A method for reducing clock skew as claimed in claim 1 wherein said step of determining a placement of said plurality of cells comprises placing said cells within a plurality of rows.

8. A method for reducing clock skew as claimed in claim 1 wherein said step of determining the placement of a plurality of clock buffers further comprises placing a first set of clock buffers of a first clock buffer type corresponding to a first clock and placing a second set of clock buffers of a second clock buffer type corresponding to a second clock.

9. A method for reducing clock skew as claimed in claim 1 wherein said step of determining the placement of said plurality of clock buffers further comprises placing a first set of clock buffers corresponding to a first clock line and placing a second clock buffer corresponding to a second clock line.

10. A method for reducing clock skew as claimed in claim 1 wherein said step of determining said routing comprises coupling each buffer of said plurality of buffers to said clock line and coupling each cell of said plurality of cells requiring a clock signal to a buffer of said plurality of buffers such that no cell requiring a clock signal is directly coupled to said clock line.

11. A method for automatically inserting buffers into a logic block having a plurality of cells, the method comprising the steps of:

(a) determining a placement of a plurality of cells within said logic block;

(b) determining a placement of a plurality of buffers within said logic block;

(c) determining a routing between said plurality of buffers, said plurality of cells and said clock line;

(d) determining the performance of said logic block;

(e) removing said plurality of buffers from said logic block if said performance is below a predetermined minimum threshold;

(f) modifying a cell of said plurality of cells if said performance is below said minimum threshold; and (g) repeating steps (a) through (g) if said performance is below said minimum threshold.

12. The method of claim 11 wherein said step (b) comprises determining a placement of a plurality of buffers within said logic block such that each clock buffer of said plurality of buffers is located in close proximity to a clock line.

13. The method of claim 11 wherein said step (b) comprises locating each buffer of said plurality of buffers in the closest available position to a clock line.

14. The method of claim 11 wherein said step (a) comprises placing said cells within a plurality of rows.

15. The method of claim 11 wherein said step (b) comprises placing a first buffer of a first buffer type and placing a second buffer of a second buffer type.

16. The method of claim 11 wherein said step (b) comprises placing a first buffer corresponding to a first clock line and placing a second clock buffer corresponding to a second clock line.

17. The method of claim 11 wherein said step (c) comprises coupling each buffer of said plurality of buffers to said clock line and coupling each cell of said plurality of cells requiring a clock signal to a buffer of said plurality of buffers such that no cell requiring a clock signal is directly coupled to said clock line.

18. The method of claim 11 wherein said step (g) comprises determining a placement of a buffer and repeating steps (c) through (g).

19. An apparatus for inserting clock buffers into a logic block having a plurality of cells to reduce clock skew, the apparatus comprising:

a bus;

a memory device which stores a set of available clock buffers, wherein the memory device is coupled to the bus; and a processor, coupled to the bus, for determining a placement of a plurality of cells within said logic block, determining a placement of a plurality of clock buffers selected from the set of available clock buffers within said logic block such that each clock buffer of said plurality of clock buffers is located in close proximity to a clock line, determining the routing between said plurality of clock buffers, said plurality of cells and said clock line, determining the performance of said logic block, removing said plurality of clock buffers from said logic block if said performance is below a predetermined minimum threshold, and modifying a cell of said plurality of cells if said performance is below said minimum threshold.

20. An apparatus for inserting clock buffers as claimed in claim 19 wherein said processor for determining a placement of a plurality of clock buffers is also for locating each clock buffer of said plurality of clock buffers in a closest available position to a clock line.

21. An apparatus for inserting clock buffers as claimed in claim 19 wherein said processor for determining the placement of said plurality of cells places said cells within a plurality of rows.

22. An apparatus for inserting clock buffers as claimed in claim 19 wherein said processor for determining the placement of said plurality of clock buffers is also for placing a first set of clock buffers of a first clock buffer type corresponding to a first clock and placing a second set of clock buffers of a second clock buffer type corresponding to a second clock.

23. An apparatus for inserting clock buffers as claimed in claim 19 wherein said processor for determining the placement of said plurality of clock buffers is also for placing a first set of clock buffers corresponding to a first clock line and placing a second clock buffer corresponding to a second clock line.

24. An apparatus for inserting clock buffers as claimed in claim 19 wherein said processor for determining said routing is also for coupling each buffer of said plurality of buffers to said clock line and coupling each cell of said plurality of cells which requires a clock signal to a buffer of said plurality of buffers such that no cell requiring a clock signal is directly coupled to said clock line.

* * * * *